United States Patent
Kuech et al.

(10) Patent No.: US 9,064,774 B2
(45) Date of Patent: Jun. 23, 2015

(54) VIRTUAL SUBSTRATES BY HAVING THICK, HIGHLY RELAXED METAMORPHIC BUFFER LAYER STRUCTURES BY HYDRIDE VAPOR PHASE EPITAXY

(71) Applicant: Wisconsin Alumni Research Foundation, Madison, WI (US)

(72) Inventors: Thomas F. Kuech, Madison, WI (US); Kevin L. Schulte, Madison, WI (US); Luke J. Mawst, Sun Prairie, WI (US); Tae Wan Kim, Madison, WI (US); Brian T. Zutter, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 59 days.

(21) Appl. No.: 13/894,681

(22) Filed: May 15, 2013

(65) Prior Publication Data

US 2014/0339505 A1    Nov. 20, 2014

(51) Int. Cl.
*H01L 21/02* (2006.01)
*H01L 29/15* (2006.01)

(52) U.S. Cl.
CPC ........ *H01L 29/155* (2013.01); *H01L 21/02395* (2013.01); *H01L 21/02433* (2013.01); *H01L 21/02455* (2013.01); *H01L 21/02463* (2013.01); *H01L 21/02507* (2013.01); *H01L 21/0251* (2013.01); *H01L 21/02546* (2013.01); *H01L 21/02617* (2013.01); *H01L 21/02664* (2013.01)

(58) Field of Classification Search
CPC ............ H01L 31/1892; H01L 21/0251; H01L 29/7783; H01L 33/12
USPC ........ 257/94, 190, 191, E33.026; 438/47, 936
See application file for complete search history.

(56) References Cited

U.S. PATENT DOCUMENTS

| | | | |
|---|---|---|---|
| 5,387,796 A | 2/1995 | Joshi et al. | |
| 6,232,138 B1 | 5/2001 | Fitzgerald et al. | |
| 8,536,446 B2 * | 9/2013 | Cornfeld et al. | 136/255 |
| 2010/0221512 A1 | 9/2010 | Lee et al. | |
| 2013/0107903 A1 | 5/2013 | Mawst et al. | |
| 2013/0143038 A1 * | 6/2013 | Leuther et al. | 428/332 |
| 2014/0225064 A1 * | 8/2014 | Khoshakhlagh et al. | 257/21 |
| 2014/0305498 A1 * | 10/2014 | Liu et al. | 136/255 |

OTHER PUBLICATIONS

Schulte et al., Metalorganic vapor phase growth of quantum well structures on thick metamorphic buffer layers grown by hydride vapor phase epitaxy., 16th International Conference on Metalorganic Vapor Phase Epitaxy, Busan, South Korea, May 23, 2012.

(Continued)

*Primary Examiner* — Minh-Loan Tran
(74) *Attorney, Agent, or Firm* — Bell & Manning, LLC

(57) ABSTRACT

Virtual substrates made by hydride vapor phase epitaxy are provided comprising a semiconductor growth substrate and a substantially strain-relaxed metamorphic buffer layer (MBL) structure comprising one or more layers of a semiconductor alloy on the growth substrate. The MBL structure is compositionally graded such that its lattice constant transitions from a lattice constant at the interface with the growth substrate that is substantially the same as the lattice constant of the growth substrate to a lattice constant at a surface opposite the interface that is different from the lattice constant of the growth substrate. The virtual substrates comprise relatively thick MBL structures (e.g., >20 μm) and relatively thick growth substrates (e.g., >0.5 mm).

20 Claims, 5 Drawing Sheets

(56) References Cited

OTHER PUBLICATIONS

Kirch et al., Characteristics of step-graded $In_xGa_{1-x}As$ and $InGaP_ySb_{1-y}$ Metamorphic Buffer Layers on GaAs substrates, May 2011.

Kirch et al., InAs/InAsP Quantum Wells on $InAs_yP_{1-y}(Sb)$ Metamorphic Buffer Layers for Mid-IR Emission, Powerpoint presentation, May 30-Jun. 3, 2010, Lake Tahoe, Nevada.

Takano et al., Threading Dislocations and Phase Separation in InGaAs Layers on GaAs Substrates Grown by Low-Temperature Metalorganic Vapor Phase Epitaxy, Japanese Journal of Applied Physics, vol. 44, No. 9A, 2005, pp. 6403-6411.

K.L Schulte, et al., Journal of Crystal Growth (Sep. 23, 2012), http://dx.doi.org/10.1016/j.jcrysgro.2012.08.053.

Quitoriano et al., Relaxed, high-quality InP on GaAs by using InGaAs and InGaP graded buffers to avoid phase separation, Journal of Applied Physics, vol. 102, No. 033511, Aug. 10, 2007, pp. 1-17.

Lee et al., High-quality metamorphic compositionally graded InGaAs buffers, Journal of Crystal Growth, vol. 312, Oct. 28, 2009, pp. 250-257.

Goldman et al., Effects of GaAs substrate misorientation on strain relaxation in InxGa1-xAs films and multilayers, Journal of Applied Physics, vol. 83, No. 10, May 15, 1998, pp. 5137-5149.

* cited by examiner

VIRTUAL SUBSTRATES BY HAVING THICK, HIGHLY RELAXED METAMORPHIC BUFFER LAYER STRUCTURES BY HYDRIDE VAPOR PHASE EPITAXY

REFERENCE TO GOVERNMENT RIGHTS

This invention was made with government support under 1232618 and 1121288 awarded by the National Science Foundation and N68335-12-C-0366 awarded by the US Navy. The government has certain rights in the invention.

BACKGROUND

There is a strong need for substrates with lattice parameters typically unattainable thorough the use of commercial substrates. The common elemental (Ge or Si) and binary III-V semiconductors (GaAs, InP) represent a few fixed lattice constants. A strategy to expand the range of substrate lattice parameters involves the use of metamorphic buffer layer (MBL) structures. This strategy begins with a binary substrate, e.g. GaAs, and grades the composition and hence lattice parameter through the heteroepitaxial growth of a semiconductor alloy, e.g. $In_xGa_{1-x}As$, starting at the binary composition. A layer of constant composition is grown at the top of the graded layer possessing the lattice constant required by the device application. This strategy is attractive due to the availability of high-quality, large area GaAs substrates and ease of controlling the composition of the MBL structure during growth via the variation of a single parameter (e.g. ratio of In/Ga) to achieve the desired in plane lattice constant.

However, growth of MBL structures containing high levels of strain relaxation and a low threading dislocation (TD) density is challenging. Often both goals are difficult to achieve in tandem, as relaxation of the MBL structure requires the introduction of misfit dislocations (MDs) to relieve strain. The introduction of these MDs is usually concurrent with the introduction of threading dislocations (TDs) which nucleate at the growth surface as a dislocation loop which propagates to the heterointerface, leaving a threading segment through the thickness of the MBL structure. In the $In_xGa_{1-x}As$ and $In_xAl_{1-x}As$ systems for example, a number of MBL structures such as constant composition, step graded, and linearly and non-linearly graded MBL structures have been grown by molecular beam epitaxy (MBE) and metalorganic vapor phase epitaxy (MOVPE) with varying degrees of success in mitigating TD density. Typically, a significant residual strain remains in the completed MBL structures.

SUMMARY

Provided herein are virtual substrates, methods of making the substrates and methods of using the substrates.

In one aspect, a virtual substrate is provided comprising a semiconductor growth substrate having a first lattice constant and a substantially strain-relaxed metamorphic buffer layer structure comprising one or more layers of a semiconductor alloy on the growth substrate. The metamorphic buffer layer structure is compositionally graded such that the lattice constant of the metamorphic buffer layer structure transitions from a lattice constant at the interface with the growth substrate that is substantially the same as the first lattice constant to a second lattice constant at a surface opposite the interface that is different from the first lattice constant. The ratio of the thickness of the metamorphic buffer layer structure to the thickness of the growth substrate is less than a value above which value warping of the metamorphic buffer layer structure would occur. In some embodiments, the thickness of the metamorphic buffer layer structure is at least about 10 µm.

In another aspect, a method of making a virtual substrate is provided, the method comprising growing a substantially strain-relaxed metamorphic buffer layer structure comprising one or more layers of a semiconductor alloy on a semiconductor growth substrate via hydride vapor phase epitaxy. The metamorphic buffer layer structure is compositionally graded such that the lattice constant of the metamorphic buffer layer structure transitions from a lattice constant at the interface with the growth substrate that is substantially the same as the first lattice constant to a second lattice constant at a surface opposite the interface that is different from the first lattice constant. The ratio of the thickness of the metamorphic buffer layer structure to the thickness of the growth substrate is less than a value above which value warping of the metamorphic buffer layer structure would occur. In some embodiments, the thickness of the metamorphic buffer layer structure is at least about 10 µm.

In another aspect, a method of using a virtual substrate is provided, the method comprising growing a first semiconductor device over a virtual substrate, the virtual substrate comprising a semiconductor growth substrate having a first lattice constant and a substantially strain-relaxed metamorphic buffer layer structure comprising one or more layers of semiconductor alloy on the growth substrate. The metamorphic buffer layer structure is compositionally graded such that the lattice constant of the metamorphic buffer layer structure transitions from a lattice constant at the interface with the growth substrate that is substantially the same as the first lattice constant to a second lattice constant at a surface opposite the interface that is different from the first lattice constant. The method further comprises removing the first semiconductor device from the virtual substrate and reusing the virtual substrate to grow a second semiconductor device.

Other principal features and advantages of the invention will become apparent to those skilled in the art upon review of the following drawings, the detailed description, and the appended claims.

BRIEF DESCRIPTION OF THE DRAWINGS

Illustrative embodiments, which are not intended to be limiting, of the invention will hereafter be described with reference to the accompanying drawings.

DETAILED DESCRIPTION

Figure 1:
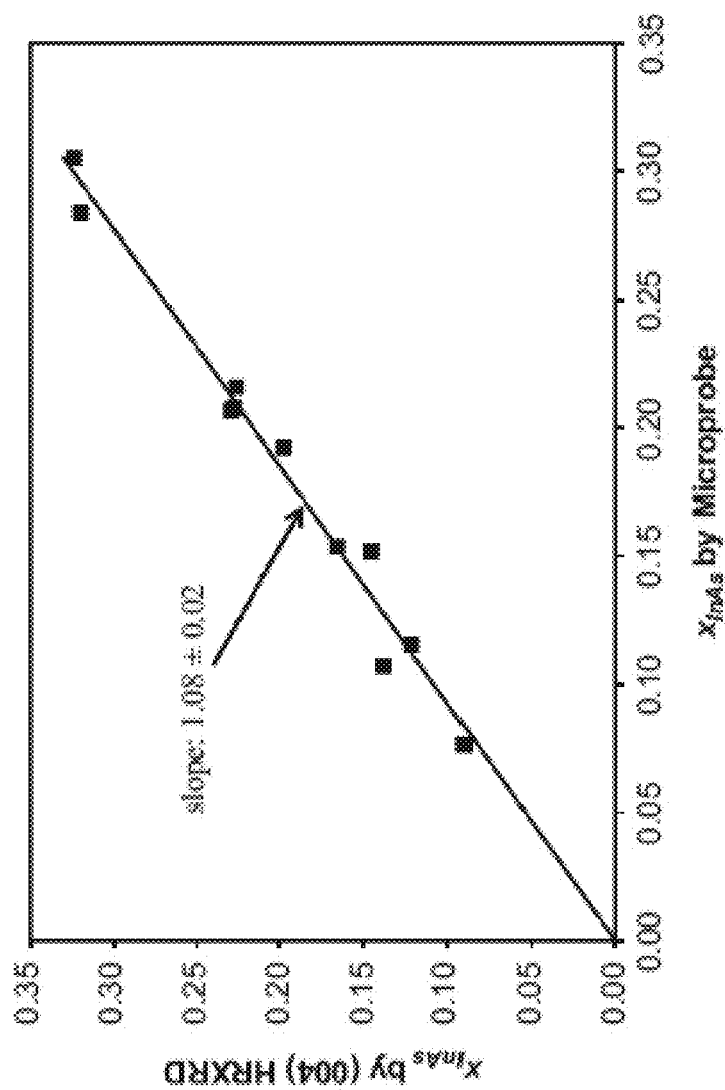
FIG. 1 shows the composition of illustrative $In_xGa_{1-x}As$ metamorphic buffer layer (MBL) structures where $x_{InAs}$ (x in $In_xGa_{1-x}As$) as measured by calculation from the (004) XRD reflection is plotted as a function of the composition as measured by electron microprobe.

Provided herein are virtual substrates, methods of making the substrates and methods of using the substrates.

The virtual substrates comprise a metamorphic buffer layer (MBL) structure on a semiconductor growth substrate. The virtual substrates are made using the technique of hydride vapor phase epitaxy (HVPE). Compared to other epitaxial methods such as MBE, MOCVD and MOVPE, HVPE is capable of high growth rates (e.g., in excess of 100 μm/hr for GaAs), which allows relatively thick layers of semiconductor to be grown in relatively short periods of time. Advantages of relatively thick layers of semiconductor include increased strain relaxation (at least until the onset of "work hardening," where the collective build-up of dislocations prevents further relaxation) and decreased threading dislocation (TD) density. Compared to other epitaxial methods such as MBE and MOVPE, HVPE is capable of using higher growth temperatures (e.g., 650° C. to 750° C.), which promotes dislocation glide and may reduce the work hardening effect.

Certain aspects of the invention are based, at least in part, on the inventors' discovery that during HVPE growth of MBL structures, at certain thicknesses the MBL structure would warp—i.e., the MBL structure would become distorted from a substantially planar state. Without wishing to be bound to any particular theory, it is believed that the warping is due, at least in part, to differences in the thermal expansion coefficients of the MBL structures and the growth substrates. By way of example only, upon cooling of an HVPE grown $In_xGa_{1-x}As$ MBL structure on a GaAs growth substrate, due to the different thermal expansion coefficients of InGaAs and GaAs, the GaAs growth substrate shrinks faster, thereby imparting compressive strain to the MBL structure. Under certain conditions (e.g., at certain thicknesses of the MBL structure), the MBL structure can become warped. Warped MBL structures renders further processing of such structures difficult and results in poorer quality semiconductor devices grown on such structures. The inventors further discovered that the warping of MBL structures could be substantially prevented provided the MBL structures were grown on sufficiently thick growth substrates.

Virtual Substrates

The virtual substrates comprise a semiconductor growth substrate having a first lattice constant and a metamorphic buffer layer (MBL) structure on the growth substrate. The MBL structure comprises one or more layers of a semiconductor alloy and is compositionally graded such that the lattice constant of the MBL structure transitions from a lattice constant at the interface with the growth substrate that is substantially the same as the first lattice constant to a second lattice constant at a surface opposite the interface that is different from the first lattice constant. The second lattice constant is generally that which is required for the desired semiconductor device (e.g., a quantum cascade laser) to be subsequently grown on the virtual substrate. Thus, the virtual substrates may be used to grow a variety of high quality semiconductor devices even though the devices may be highly lattice-mismatched to the underlying growth substrate.

A variety of semiconductors may be used for the semiconductor growth substrate. In some embodiments, the semiconductor growth substrate is composed of a group III/V alloy. Exemplary group III/V alloys include GaAs, InP, GaP, InAs and GaSb.

A variety of semiconductors may be used for the layer(s) of the MBL structure, depending upon the desired semiconductor growth substrate and the desired semiconductor device to be subsequently grown on the virtual substrate. The growth substrate and the MBL structure may have elements in common. In some embodiments, the MBL structure comprises layer(s) of a group III/V alloy. Exemplary group III/V alloys include InGaAs, GaAsSb, GaAsP, InPSb, InAsP, and InGaP. In these alloys, it is to be understood that the relative proportions of certain of the elements may vary (e.g., the relative proportion of indium and gallium in InGaAs). The particular relative proportions used in the layer(s) depend upon the compositional grading profile and the magnitude of lattice mismatch across the MBL, as further described below.

The MBL structure is compositionally graded such that the lattice constant of the MBL structure transitions from a lattice constant at the interface with the semiconductor growth substrate that is substantially the same as the lattice constant of the growth substrate to a lattice constant at a surface opposite the interface that is different from the lattice constant of the growth substrate. The compositional grading profile used for the MBL structure is not particularly limited. By way of example only, the composition of the MBL structure may be continuously graded such that the composition (and hence, the lattice constant) continuously transitions from one composition at the bottom of the MBL structure to another, different composition at the top of the MBL structure. In another example, the composition of the MBL structure may be step-graded such that the composition transitions from one composition at the bottom of the MBL structure to another, different composition at the top of the MBL structure in a discrete number of steps (i.e., layers).

MBL structures having different magnitudes of lattice mismatch across the MBL structure may be used. In some embodiments, the lattice constant of the MBL structure at the interface with the semiconductor growth substrate differs from the lattice constant of the MBL structure at a surface opposite the interface by at least about 0.5%. This includes embodiments in which the difference is at least about 0.6%, at least about 1%, at least about 1.5%, at least about 2.5%, at least about 3%, at least about 3.5%, at least about 4%, at least about 4.5%, at least about 5%, at least about 5.5%, or at least about 6%. This includes embodiments in which the difference is in the range from about 0.5% to about 3% or from about 1% to about 3%.

In some embodiments, the MBL structure comprises $In_xGa_{1-x}As$ wherein x is graded from 0 (or from a value substantially near to 0) to a maximum value, which may vary depending upon the desired lattice constant for the top of the MBL structure. For example, the maximum value of x (i.e., indium content) may vary from about 0.1 to about 0.4. This includes embodiments in which the maximum value is about 0.35, about 0.30, about 0.25, about 0.20, or about 0.15. In some embodiments, the MBL structure comprises $In_xGa_{1-x}As$ wherein x is step-graded from 0 (or from a value substantially near to 0) to any of the disclosed maximum values. Different step-sizes, or Δx, may be used. By way of example only, Δx may be 0.005, 0.01, 0.02, 0.03, or 0.05. The same step-size may be used throughout the MBL structure, but different step-sizes may also be used.

In some embodiments, the MBL structure comprises $GaAs_ySb_{1-y}$ wherein y is graded from 0 (or from a value substantially near to 0) to a maximum value, which may vary depending upon the desired lattice constant for the top of the MBL structure. For example, the maximum value of y may vary from about 0.5 to about 1.0. This includes embodiments in which the maximum value is about 0.9, about 0.8, about 0.7 or about 0.6. In some embodiments, the MBL structure comprises $GaAs_ySb_{1-y}$ wherein y is step-graded from 0 (or from a value substantially near to 0) to any of the disclosed maximum values. Different step-sizes, or Δy, may be used as described above with respect to $In_xGa_{1-x}As$ MBL structures.

In some embodiments, the MBL structure comprises $GaAs_yP_{1-y}$ wherein y is graded from 0 (or from a value substantially near to 0) to a maximum value, which may vary depending upon the desired lattice constant for the top of the MBL structure. For example, the maximum value of y may vary from about 0.05 to about 1.0. This includes embodiments in which the maximum value is about 0.9, about 0.7, about 0.5, about 0.3 or about 0.1. In some embodiments, the MBL structure comprises $GaAs_yP_{1-y}$ wherein y is step-graded from 0 (or from a value substantially near to 0) to any of the disclosed maximum values. Different step-sizes, or Δy, may be used as described above with respect to $In_xGa_{1-x}As$ MBL structures.

The semiconductor growth substrates and/or the layer(s) of semiconductor alloy of the MBL structure may be doped or undoped.

The MBL structures of the virtual substrates are typically quite thick. The thickness of the layer(s) of semiconductor alloy of the MBL structures as well as the overall thickness of the MBL structure is generally that which is sufficient to maximize the degree of strain-relaxation and to minimize the density of threading dislocations at the top surface of the MBL structure. In some cases, the thickness of the MBL structure is also sufficient to accommodate the removal of material from the top surface of the MBL structure during one or more steps of chemical-mechanical polishing as further described below. The specific thicknesses may depend upon the magnitude of lattice mismatch across the MBL. However, the thicknesses are typically greater than what could be practically achieved by other epitaxial methods such as MBE and MOVPE, which are restricted to much slower growth rates as compared to HVPE. In some embodiments, the thickness of the MBL structure is at least about 10 μm. This includes embodiments in which the thickness is at least about 15 μm, at least about 20 μm, at least about 25 μm, or at least about 30 μm. This includes embodiments in which the thickness is in the range from about 10 μm to about 50 μm, about 20 μm to about 50 μm, or about 20 μm to about 30 μm. For multilayered MBL structures, such as step-graded MBL structures, the thickness of the individual layers of semiconductor alloy may be in the range of from about 500 nm to about 20 μm. This includes thicknesses in the range of from about 1 μm to about 15 μm. The thicknesses of the individual layers need not be the same. By way of example only, the thicknesses of the individual layers except for a cap layer (top-most layer) may be in the range of from about 700 nm to about 21 μm and the thickness of the cap layer may be in the range of from about 10 μm to about 15 μm. As described above, the inventors found that during HVPE growth of at least some MBL structures, the MBL structures became warped at the disclosed overall thickness values. In some cases, the MBL structures could be characterized as having bow-shaped, or arched, cross-sections. The existence of warping may be detected by visual inspection of the MBL structures.

The growth substrates of the virtual substrates are also typically quite thick. The thickness is generally that which is sufficient to substantially prevent the warping of the MBL structure. The specific thickness can depend upon several parameters. In particular, the specific thickness of the growth substrate can depend upon the thickness of the MBL structure as well as the magnitude of the lattice mismatch across the MBL structure such that thicker MBL structures and greater magnitudes of lattice mismatch can require thicker growth substrates in order to prevent warping. The specific thickness of the growth substrate can depend upon the diameter of the virtual substrate such that larger diameters can require thicker growth substrates in order to prevent warping. For non-circular virtual substrates, the diameter may be taken as the largest dimension across the surface of the virtual substrate. The specific thickness of the growth substrate can depend upon the differences in thermal expansion coefficients of the MBL structure and the growth substrate as well as the growth temperature used to grow the MBL structure such that greater differences in thermal expansion coefficients and higher growth temperatures can require thicker growth substrates in order to prevent warping. Depending upon the selected conditions, in some embodiments, the thickness of the growth substrate is at least about 300 μm. This includes embodiments in which the thickness of the growth substrate is at least about 400 μm, at least about 600 μm, at least about 800 μm, or at least about 1 mm.

For a set of the conditions described above (e.g., a selected MBL thickness, a selected diameter, etc.), there will be a critical thickness for the growth substrate, below which thickness the MBL structure will warp and above which thickness the MBL structure will be substantially prevented from warping. Similarly, for a set of the conditions described above (e.g., a selected diameter, etc.), there will be a critical ratio of the thickness of the MBL structure to the thickness of the growth substrate, above which ratio the MBL structure will warp and below which ratio the MBL structure will be substantially prevented from warping. In some embodiments, the ratio of the thickness of the MBL structure to the thickness of the growth substrate is less than about 0.1. This includes embodiments in which the ratio of the thickness of the MBL structure to the thickness of the growth substrate is less than about 0.09, less than about 0.08, less than about 0.07, less than about 0.05, or less than about 0.03. In some embodiments, the ratio of the thickness of the growth substrate to the diameter of the virtual substrate is at least about 0.1 mm/inch. This includes embodiments in which the ratio of the thickness of the growth substrate to the diameter of the virtual substrate is at least about 0.2 mm/inch, at least about 0.25 mm/inch, at least about 0.3 mm/inch, at least about 0.4 mm/inch, or at least about 0.5 mm/inch.

The semiconductor MBL structures may be characterized by certain properties such as residual strain and threading dislocation (TD) density. Regarding residual strain, the residual strain of the layer(s) of the metamorphic buffer layer structure may be calculated as $$\varepsilon_r = \frac{a_\| - a_r}{a_r},$$

where $\alpha_\|$ is the in-plane lattice constant of the strained layer and $a_r$ is the relaxed lattice constant the layer would assume if it were free of the growth substrate. The lattice constants of the strained layers may be determined using a combination of high-resolution double crystal x-ray diffraction (DCXRD) and reciprocal space mapping by triple crystal x-ray diffraction (TCXRD), as described in Example 1, below. In some embodiments, the residual strain of the layer(s) of the MBL structure is in the range of from about 0.00020 to about −0.00020. This includes embodiments in which the residual strain of the layers is in the range of from about 0.00015 to about −0.00015, from about 0.00010 to about −0.00010, or from about 0.00005 to about −0.00005. MBL structures having residual strain within these ranges may be considered to be substantially strain-relaxed.

Regarding TD density, the TD density of the MBL structures may be determined using the techniques of transmission electron microscopy (TEM), scanning electron microscopy (SEM)-cathodoluminescence, or etch pit density (EPD). TEM is useful for quantifying TD densities of about $10^8$ cm$^{-2}$ or greater; SEM-cathodoluminescence is useful for quantifying TD densities of about $10^6$ to $10^7$ cm$^{-2}$; and EPD is useful for quantifying TD densities of about $10^6$ cm$^{-2}$ or less. The TD density of the MBL structures is dependent on the amount of strain being relaxed by the MBL structure, i.e., the magnitude of lattice mismatch across the MBL structure. The TD density of the MBL structures is also dependent upon the grading rate (in units of mismatch/thickness) used in growing the MBL structure. In some embodiments, the TD density of the MBL structure is no greater than about $10^9$ cm$^{-2}$. This includes embodiments in which the TD density is no greater than about $10^8$ cm$^{-2}$, about $10^7$ cm$^{-2}$, about $10^6$ cm$^{-2}$, about $10^5$ cm$^{-2}$ or about $10^4$ cm$^{-2}$. In some embodiments, the TD density of an MBL structure, the MBL structure comprising In$_x$Ga$_{1-x}$As wherein x is graded from a value substantially near to 0 to a value of less than about 0.25, is no greater than about $10^6$ cm$^{-2}$ as measured using either EPD or SEM-cathodoluminescence. This includes embodiments in which the TD density is no greater than about $10^5$ cm$^{-2}$ or no greater than about $10^4$ cm$^{-2}$ as measured using either EPD or SEM-cathodoluminescence. The TD density of a MBL structure may be defined with respect to the composition at the top of the MBL structure.

The virtual substrates may further comprise additional material layers. In some embodiments, the virtual substrate further comprises a selective etch layer on the MBL structure. The selective etch layer is composed of a material upon which semiconductor devices may be subsequently grown and which may be selectively removed (e.g., by wet chemical etching) in order to release the subsequently grown semiconductor device from the virtual substrate. Selective etch layers may be composed of a material which has a higher reactivity in a wet chemical etch solution than the virtual substrate and the semiconductor device. Thus, upon placing the virtual substrate/selective etch layer/semiconductor device structure in the wet chemical etch solution, the selective etch layer will be dissolved, thereby releasing the semiconductor device and the reusable virtual substrate.

The virtual substrates may further comprise a semiconductor device over the MBL structure. The type of semiconductor device is not limited. Exemplary semiconductor devices are transistors and quantum cascade lasers.

Methods of Making the Virtual Substrates

The virtual substrates are made by growing a metamorphic buffer layer (MBL) structure comprising one or more layers of a semiconductor alloy on a semiconductor growth substrate via hydride vapor phase epitaxy (HVPE). HVPE is an vapor phase epitaxial growth technique for growing layers of semiconductor in which certain semiconductor elements (e.g., group III semiconductor elements) are provided as chlorides and certain semiconductor elements (e.g., group V semiconductor elements) are provided as hydrides. The technique may be distinguished from metalorganic vapor phase epitaxy (MOVPE) in which certain semiconductor elements are provided as metalorganic compounds. The growth is accomplished by exposing the growth substrate to a gas mixture comprising a source of each of the elements of the semiconductor alloy under growth conditions sufficient to compositionally grade the MBL structure such that the lattice constant of the MBL structure transitions from a lattice constant at the interface with the growth substrate that is substantially the same as the lattice constant of the growth substrate to a lattice constant at a surface opposite the interface that is different from the lattice constant of the growth substrate. The growth conditions for carrying out the HVPE may be adjusted to provide MBL structures having any of the compositional grading profiles, compositions, thicknesses and properties described above. These growth conditions include the partial pressures of each of the gases in the gas mixture, the growth temperature and the growth time. An exemplary reactor for carrying out HVPE is described in Example 1, below. Example 1 also describes exemplary suitable growth conditions for growing a substantially strain-relaxed MBL structure comprising step-graded In$_x$Ga$_{1-x}$As on a GaAs growth substrate and further demonstrates the effect of certain growth conditions on growth rate and composition. Thus, growth conditions for growing MBL structures having other compositional grading profiles, compositions and thicknesses as well as MBL structures made from other semiconductor alloys may be similarly determined.

The methods may further include a variety of steps subsequent to the growth of the MBL structure. In some embodiments, the method further comprises planarizing the top surface of the MBL structure (e.g., the surface opposite to the interface with the growth substrate) using chemical-mechanical polishing (CMP). Due to lattice-mismatching of the layer(s) of the MBL structure with the growth substrate, the top surface of the as-grown MBL structure typically exhibits cross hatch morphology. Thus, planarization using CMP may be used in order to decrease the surface roughness of the top surface. Chemical-mechanical polishing may be carried out using commercially available tools, pads and slurries.

The inventors have discovered that the pressure applied to the top surface of the as-grown MBL structure (i.e., the polishing pressure) is a critical parameter to achieving a desired surface roughness. Contrary to expectations, the inventors found that greater polishing pressures actually resulted in rougher surfaces and that lower pressures were required in order to achieve smoother surfaces. Thus, in some embodiments, the planarization step comprises carrying out the CMP at a polishing pressure that is sufficient to provide a desired surface roughness. The specific polishing pressure may depend upon the composition at the top surface of the MBL structure as well as the desired surface roughness. Surface roughness may be measured using atomic force microscopy (AFM) as discussed in Examples 1 and 2, below, and may be defined as a root mean square (rms) value over a particular area. In some embodiments, the rms of surface roughness over an area of about 100 μm$^2$ is less than about 10 nm. This includes embodiments in which the rms of surface roughness over an area of about 100 μm$^2$ is less than about 8 nm, less than about 6 nm, less than about 4 nm, or less than about 2 nm. In some embodiments, the polishing pressure is less than about 15 psi. This includes embodiments in which the polishing pressure is less than about 12 psi, less than about 10 psi, less than about 8 psi, less than about 6 psi, or less than about 5 psi. This further includes embodiments in which the polishing pressure is in the range of from about 1 psi to about 10 psi, from about 1 psi to about 8 psi, from about 1 psi to about 6 psi, or from about 2 psi to about 5 psi.

The use of CMP, and especially, the use of multiple steps of CMP, can result in the removal of several microns (e.g., 3-5 μm) of material from the top surface of the MBL structure. Thus, this is typically not a technique that would be used with other epitaxial methods such as MBE, MOCVD and MOVPE which can only provide relatively thin layers of semiconductor. By contrast, the HVPE methods disclosed herein are capable of providing relatively thick layers of semiconductor, including layers thick enough to accommodate the removal of several microns of material during one or more steps of CMP.

In some embodiments, the method further comprises polishing the top surface of a MBL structure (which may be a planarized MBL structure) using chemical polishing (CP). Chemical polishing may be used to further decrease the surface roughness of planarized MBL structures, e.g., to a rms of surface roughness over an area of about 100 µm$^2$ of less than about 2 nm or less than about 1 nm. Chemical polishing may be carried out using commercially available tools and chemical etchants. In some embodiments, the method further comprises exposing the top surface of a MBL structure (which may be a planarized and/or polished MBL structure) to ozone. Ozone treatment may be used to remove carbon contamination from the top surface of the MBL structure, which may be present due to the use of CMP. In some embodiments, the method further comprises exposing the top surface of a MBL structure (which may be a planarized and/or polished and/or ozone-treated MBL structure) to a wet chemical etch (e.g., $NH_4OH+H_2O_2+H_2O$). The wet chemical etch may be used to further prepare the top surface of the MBL structure for the growth of additional material layers, e.g., a selective etch layer, and/or a semiconductor device.

In some embodiments, the method further comprises growing additional material layers (e.g., a selective etch layer as described above) on the top surface of the metamorphic buffer layer structure (which may be a planarized and/or polished and/or ozone-treated and/or chemically etched metamorphic buffer layer structure). These additional material layers may be grown using HVPE, although other methods may be used.

Methods of Using the Virtual Substrates

The virtual substrates may be used to grow a variety of semiconductor devices which may be highly lattice-mismatched to the underlying growth substrate. The semiconductor devices may be grown using HVPE, although other methods may be used. The grown semiconductor devices may be subsequently removed from the virtual substrates. For example, for virtual substrates comprising a selective etch layer on the metamorphic buffer layer (MBL) structure and a semiconductor device on the selective etch layer, the semiconductor device may be removed by wet chemical etching the selective etch layer. After removal, the virtual substrate may be reused to grow another semiconductor device. Since the removal step may damage the top surface of the MBL, prior to reuse, the MBL may be subjected to CMP, CP, ozone-treatment, wet chemical etching, or combinations thereof, as described above, in order to restore the quality of the top surface of the MBL. Repeated reuse of the virtual substrate, especially with use of CMP between reuse steps, can result in the removal of a significant amount of material from the top surface of the MBL structure. Thus, reuse of MBL structures made using epitaxial methods such as MBE, MOCVD and MOVPE would generally be precluded since these methods can only provide relatively thin layers of semiconductor. By contrast, the HVPE methods disclosed herein are capable of providing relatively thick layers of semiconductor, including layers thick enough to accommodate the removal of several microns of material during repeated reuse of the virtual substrate. In some embodiments, the virtual substrate may be reused at least 3 times, at least 5 times, at least 7 times or at least 10 times.

The virtual substrates and the methods of making and using the substrates will be understood more readily by reference to the following examples, which are provided by way of illustration and are not intended to be limiting.

EXAMPLES

Example 1

Materials and Methods

Samples were grown in a custom-built, atmospheric pressure HVPE system as described in K. L. Schulte et al., "Controlled formation of GaAs pn junctions during hydride vapor phase epitaxy of GaAs", *Journal of Crystal Growth*, Vol. 352, Issue 1, 1 Aug. 2012, pp. 253-257. Briefly, the reactor consisted of a quartz tube enclosed in a 4-zone hot wall furnace which allows independent control of the temperatures in the preheat, deposition (growth), mixing, and source zones. Gas phase HCl in a $H_2$ carrier was introduced to source boats containing liquid Ga and In, generating the group III transport agents: GaCl and InCl. The sources were designed using both experimental data and CFD modeling to produce the conversion of HCl to MCl (M=Ga or In) of >98% for all flows used in this study. See K. L. Schulte et al., "Controlled formation of GaAs pn junctions during hydride vapor phase epitaxy of GaAs", *Journal of Crystal Growth*, Vol. 352, Issue 1, 1 Aug. 2012, pp. 253-257; V. S. Ban, "Mass spectrometric and thermodynamics studies of the CVD of some III-V compounds", *Journal of Crystal Growth*, 17 (1972) 19-30; V. S. Bans et al., "Mass spectrometric and thermodynamic studies of vapor-phase growth of $In_{(1-x)}Ga_xP$", *Journal of Physics and Chemistry of Solids*, 34 (1973) 1119-1129; A. G. Sigai et al., "Vapor Growth of $In_{1-x}Ga_xP$ for P-N Junction Electroluminescence", *Journal of The Electrochemical Society*, 120 (1973) 947-955. $AsH_3$ was introduced as the group V source through a separate reactor port. The cation and anion gases were kept separated until merging within the mixing zone, in order to minimize premature deposition on reactor surfaces. Additional or 'make-up' HCl was also introduced through the $AsH_3$ port to reduce the supersaturation and minimize extraneous deposition. The use of the $AsH_3$ allows for independent control of the V-III ratio and cation reactant flow ratio for the exploration of an expanded growth parameter space.

Substrates of (001) oriented undoped GaAs with a 0°±0.5° or 4°⇒[111]B miscut were used. The substrates were quarter pieces cut from a 2 inch diameter, 350 µm thick wafer. High purity $H_2$, HCl, and $AsH_3$ gases were utilized, along with six-9's pure Ga and In source metals. All gas streams were purified at the point of use to remove oxygen, water, and other impurities. The source temperature was constant for all growths at 780° C. Deposition (growth) temperatures ranged from 650 to 750° C., with the mixing zone temperature typically set 15° C. higher. In this example, $P_{GaCl}$ and $P_{InCl}$ refer to the partial pressure of HCl sent to each respective source, while $P_{HCl}$ refers to the extra HCl not provided to either cation metal source but added downstream of the sources. In this example, $P_{GaCl}$ and $P_{AsH_3}$ were held constant at 0.0016 and 0.0021 atm., respectively. Deposition (growth) temperature, $P_{InCl}$, and $P_{HCl}$ were then varied to observe their effects on both growth rate and composition.

The MBL structure grown in this example was compositionally-graded over a series of ten constant composition steps, starting from the GaAs substrate. The In concentration of each successive step was increased by step increases in the flow of InCl for nine separate time intervals. The final or top layer was >10 µm thick, grown at a composition equivalent to the lattice parameter required for the superlattice (SL)

growth. All the layers within the MBL structure were grown at 740° C. with the $P_{GaCl}$, $P_{AsH_3}$, and $P_{HCl}$ at 0.0013, 0.0024, and 0.0003 atm., respectively.

Figure 5:
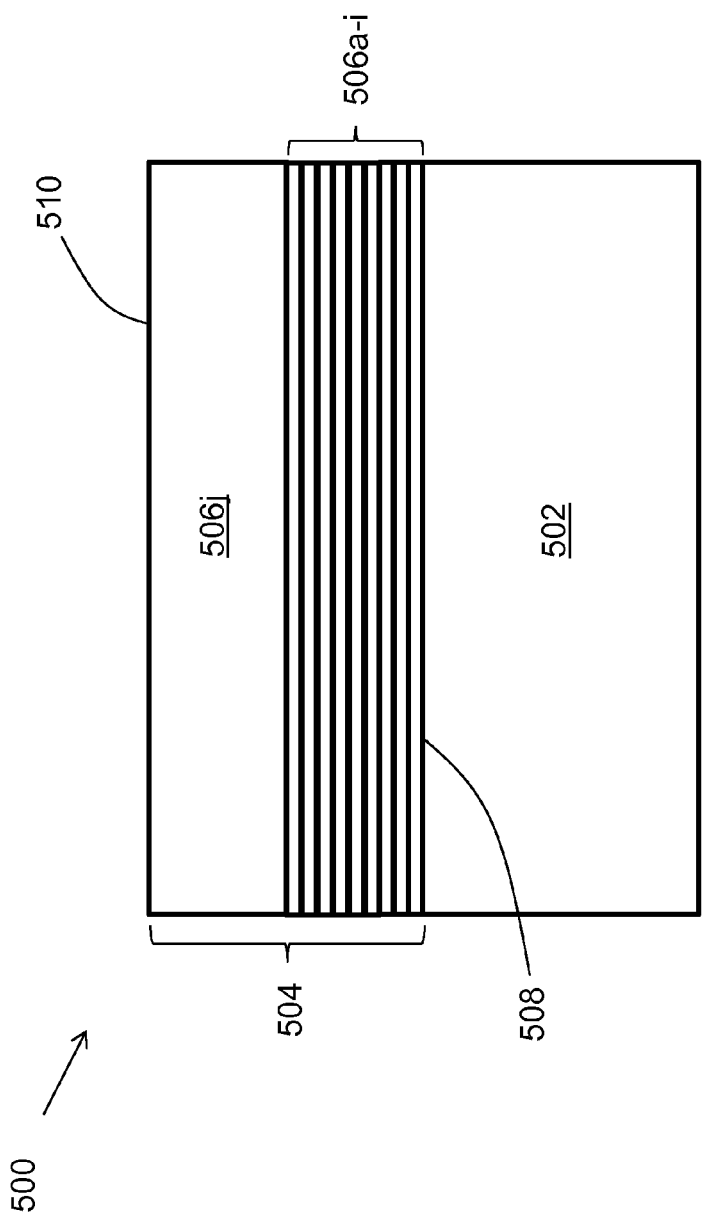
FIG. 5 depicts a virtual substrate according to an illustrative embodiment.

The virtual substrate 500 made by the methods described in this Example 1 is illustrated in FIG. 5. The virtual substrate 500 includes the semiconductor growth substrate 502 (GaAs) having a first lattice constant and a substantially strain-relaxed metamorphic buffer layer structure 504 on the growth substrate 502. The metamorphic buffer layer structure 504 comprises multiple layers 506a-j of a semiconductor alloy ($In_xGa_{1-x}As$). The composition of each of the multiple layers 506a-j is provided in Table 1, below, in which layer 506a corresponds to layer 1 and layer 506j corresponds to the cap layer. Thus, the metamorphic buffer layer structure 504 is compositionally graded such that the lattice constant of the metamorphic buffer layer structure 504 transitions from a lattice constant at the interface 508 with the growth substrate 502 that is substantially the same as the first lattice constant to a second lattice constant at a surface 510 opposite the interface that is different from the first lattice constant.

The growth rates were measured in cross-section by scanning electron microscopy (SEM). The layered sample composition was analyzed by two methods. A combination of high-resolution double crystal x-ray diffraction (DCXRD) and reciprocal space mapping by triple crystal x-ray diffraction (TCXRD) on the symmetric (004) and asymmetric (115) reflections was used to analyze in-plane and out-of-plane lattice parameters. A Cu Kα source passed through a hybrid monochromator consisting of closely coupled x-ray mirror and 4 bounce Ge 220 monochromator was utilized. The TCXRD spectra were collected with an additional 3 bounce Ge 220 analyzer crystal placed in front of the diffracted beam. From this information, the relaxed lattice parameter, % relaxation, and residual strain were calculated. Assuming Vegard's law, composition was determined Composition was also measured by electron probe microanalysis in cross-section, yielding an independent, chemical determination of the composition profile.

As-grown samples exhibited cross hatch morphology. To prepare the MBL structure for subsequent SL growth by MOVPE, the MBL structure was planarized using chemical-mechanical polishing (CMP). CMP was performed using a Logitech CDP1-SCH polishing tool employing an Eminess Suba X II polishing pad and a slurry of 96% Eminess Ultra-Sol 556 Colloidal Silica and 4% Clorox bleach. Surface roughness was analyzed by atomic force microscopy (AFM) to characterize surface roughness before and after polishing.

A 20 period, $In_{0.33}Ga_{0.67}As$ (3.1 nm)/$Al_{0.90}In_{0.10}As$ (7.2 nm) strain-balanced superlattice structure was grown on pieces of as-grown and CMP-prepared MBL by MOVPE. Both MBL pieces were cleaved from a single HVPE growth. The reactor pressure was 100 Torr and the total carrier flow was 12 SLM. Prior to SL growth, a 0.5 μm thick $In_{0.20}Ga_{0.80}As$ buffer layer was grown at 600° C. The superlattice structure was grown at 625° C. The $In_{0.33}Ga_{0.67}As$ layers had a growth rate of 0.93 Å/s with a V/III ratio=600, and In/III=0.4314 with an In molar flow of $2.07 \times 10^{-6}$ mol/min. The $Al_{0.897}In_{0/103}As$ layers had a growth rate of 0.12 nm/s, V/III=400, In/III=0.2033 with an Al molar flow of $5.547 \times 10^{-6}$ mol/min. The superlattice structure is typical of those in devices such as quantum cascade lasers. The structure of these two devices was assessed and compared by DCXRD.

Results

As shown in FIG. 1, the results of the composition determination by Vegard's law using the (004) lattice parameter were plotted against the composition as determined by electron microprobe. The data by both methods generally agree, with a slope of 1.08±0.02 for the fit line. The slope is larger than unity due to the tetragonal distortion induced by the lattice misfit strain. The general agreement of the composition determined solely from the out-of-plane lattice parameter and chemical determination by microprobe indicates two things: 1) XRD on the (004) reflections is sufficient for the determination of composition for the test structures exploring the thermodynamic parameter space, and 2) MBL structures grown in this example are highly relaxed containing low amounts of tetragonal distortion and thus low residual strain. The MBL structure growth was subjected to a more comprehensive analysis using x-ray analysis of the (004) and (115) reflections.

Figure 2:
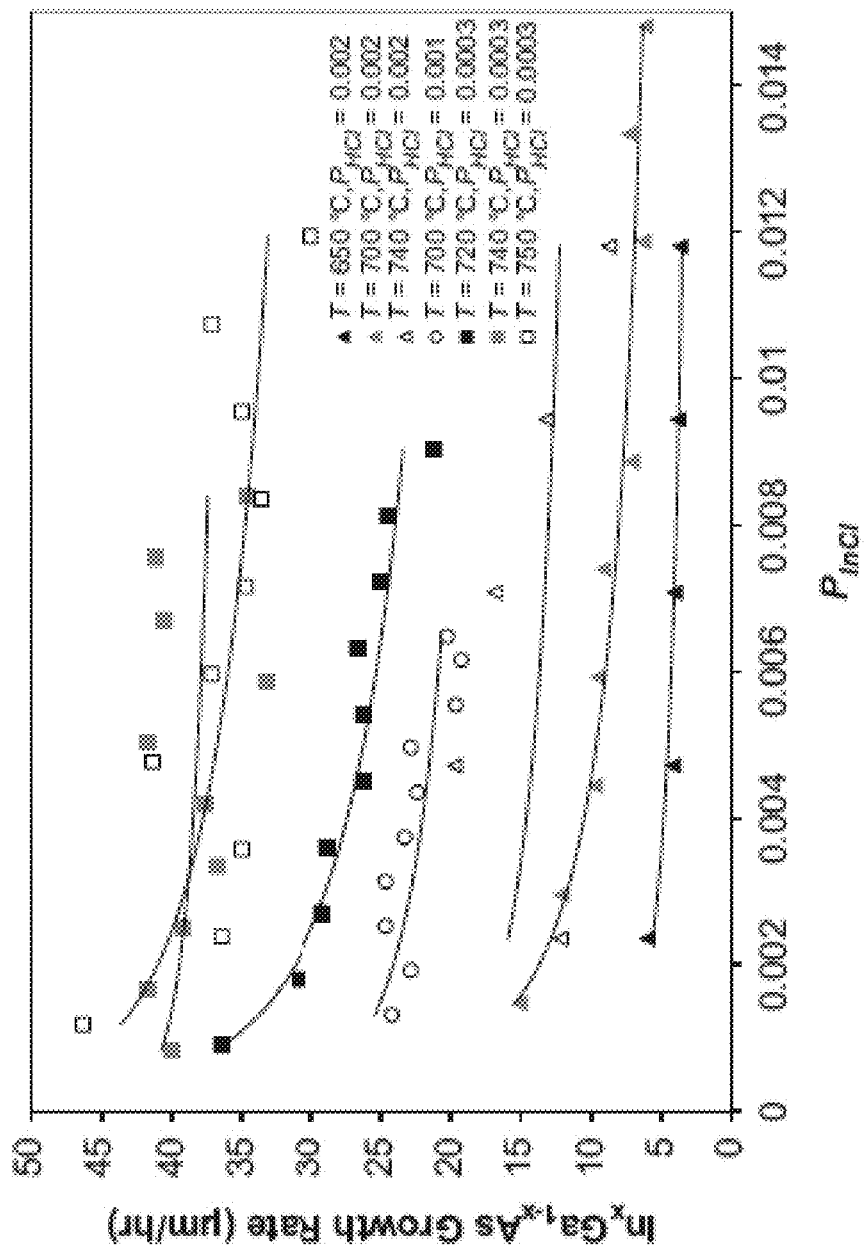
FIG. 2 shows the growth rate of illustrative $In_xGa_{1-x}As$ MBL structures versus partial pressure of indium chloride ($P_{InCl}$) for various conditions of deposition (growth) temperature (T) and partial pressure of makeup HCl ($P_{HCl}$).

$In_xGa_{1-x}As$ growth rate as a function of InCl partial pressure ($P_{InCl}$) is plotted in FIG. 2 for different growth temperatures and partial pressures of 'make-up' HCl ($P_{HCl}$). The growth rate decreases as a function of increasing $P_{InCl}$ at all growth conditions and temperatures investigated. At a given $P_{HCl}$, the growth rate increases with increasing temperature. At a given growth temperature, growth rate decreases with increasing $P_{HCl}$ flow. These data indicate that the growths in this study were generally limited by kinetics.

Figure 3:
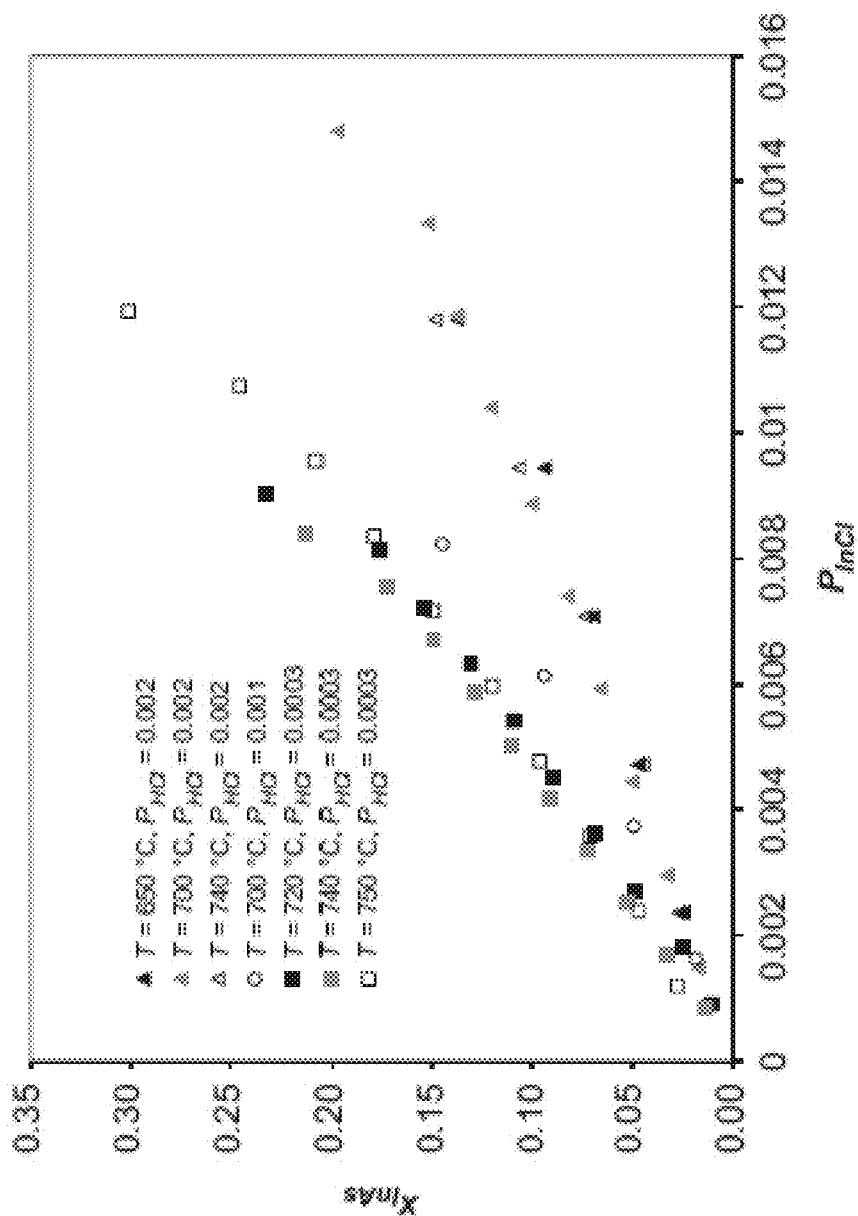
FIG. 3 shows the composition of illustrative $In_xGa_{1-x}As$ MBL structures where $x_{InAs}$ (x in $In_xGa_{1-x}As$) is plotted as a function of partial pressure of indium chloride ($P_{InCl}$) for various conditions of deposition (growth) temperature (T) and partial pressure of makeup HCl ($P_{HCl}$).

$x_{InAs}$ is also plotted as a function of $P_{InCl}$ in FIG. 3. $x_{InAs}$ increases near-linearly with $P_{InCl}$ for a given set of growth conditions. Interestingly, the composition is generally insensitive to growth temperature at a given $P_{HCl}$, apparently depending only on $P_{InCl}$. $P_{HCl}$ has a strong effect on layer composition as well leading to a decrease in the slope of the $x_{InAs}$ vs. $P_{InCl}$ curve to decrease. At T=700° C., the slope decreases from 1920/atm InCl to 1260/atm InCl by simply doubling $P_{HCl}$ from 0.001 to 0.002.

The structural parameters of the MBL structure are summarized in Table 1 below. The steps all were between 1.2 and 1.7 μm thick, and the cap layer was 12.7 μm thick. These layers were grown at growth rates between 34 and 42 μm/hr. The growth rate of the cap layer was 34.6 μm/hr. Composition and relaxation were determined from reciprocal space maps of the (004) and (115) reflections of the MBL structure. The cap layer, 12.7 μm thick, is almost fully relaxed. The residual strain, calculated as $$\varepsilon_r = \frac{a_\| - a_r}{a_r},$$

where $a_\|$ is the in-plane lattice constant of the strained epilayer and $a_r$ is the relaxed lattice constant the layer would assume if it were free of the substrate is $-0.0011 \pm 0.0001$. The composition of the cap layer was $x_{InAs}=0.23$.

TABLE 1

Structural parameters of the 10 step MBL grown in this Example.

| Layer | Thickness (μm) | $x_{InAs}$ | Residual strain (±0.0002) |
|---|---|---|---|
| 1 | 1.34 | 0.01 | 0.0001 |
| 2 | 1.39 | 0.03 | 0.0001 |
| 3 | 1.31 | 0.05 | 0.0002 |
| 4 | 1.23 | 0.07 | 0.0001 |
| 5 | 1.25 | 0.09 | 0.0001 |
| 6 | 1.39 | 0.11 | −0.0001 |
| 7 | 1.39 | 0.13 | 0.0000 |
| 8 | 1.69 | 0.16 | −0.0002 |
| 9 | 1.72 | 0.18 | −0.0005 |
| Cap | 12.7 | 0.23 | −0.0011 |

Figure 4:
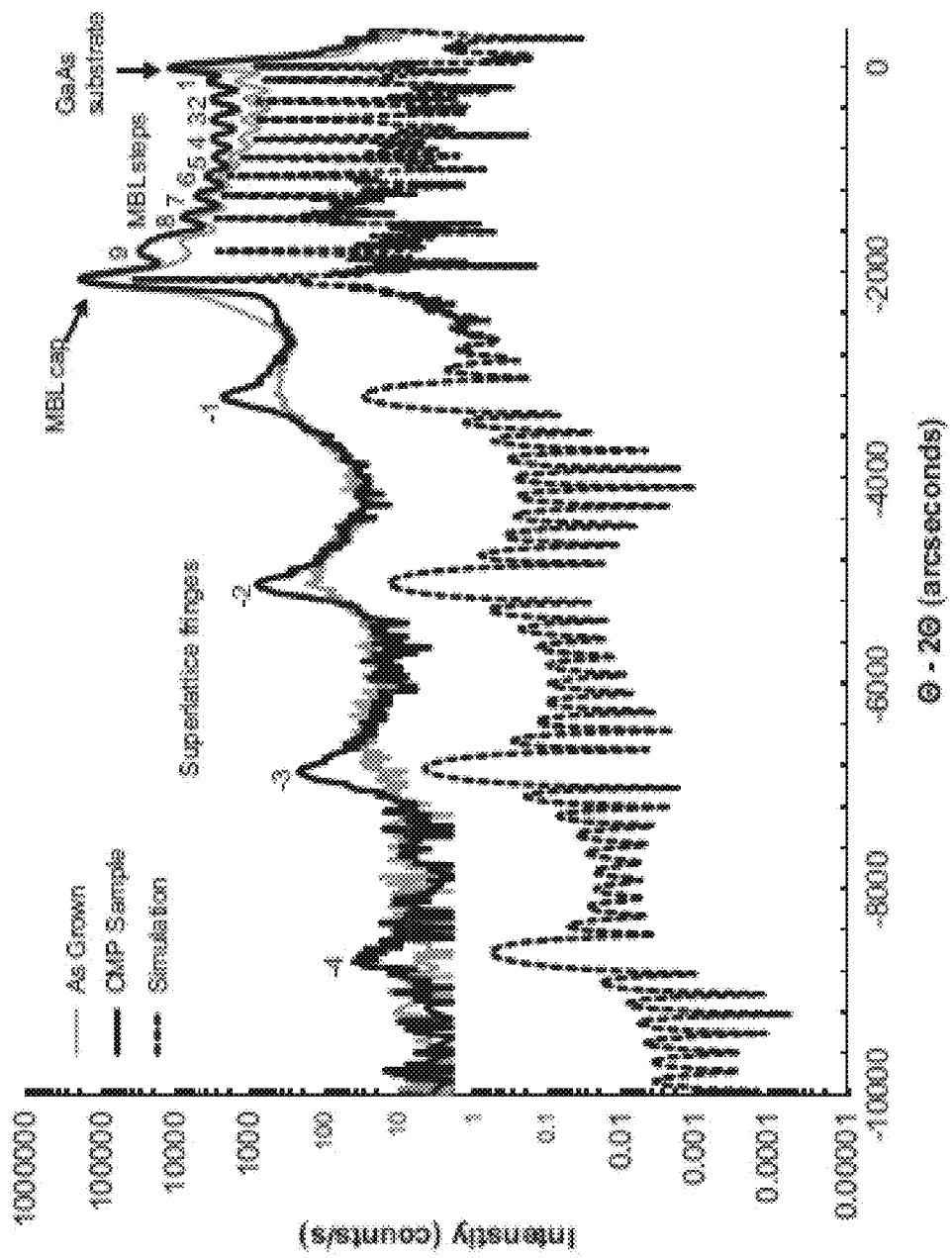
FIG. 4 shows the HRXRD of the (004) reflection of a 20 period, $In_{0.33}Ga_{0.67}As$ (3.1 nm)/$Al_{0.90}In_{0.10}As$ (7.2 nm) strain-balanced superlattice (SL) structure grown on pieces of an illustrative as-grown and CMP planarized MBL structure. Also shown is a simulated spectrum of the SL structure.

Atomic force micrographs of the as-grown and CMP-polished MBL structures were obtained (data not shown). The AFM results showed striations running along the [1-10] direction of the as grown sample which are typical of mismatched $In_xGa_{1-x}As$ growth. CMP planarized the surface and reduced the root mean square (rms) of surface roughness from 2.10 to 1.39 nm before and after polishing, respectively. Two microns of the surface material were removed in the CMP process. As shown in FIG. 4, the use of CMP led to a more highly resolved and intense (004) DCXRD curve generated by the MOVPE grown SL structure. The MBL structure steps and superlattice fringes have been labeled in the figure. Some of the peaks related to the as grown MBL structure are shifted to slightly more negative values, which is attributed to small compositional variation across the wafer. As an indication of the improvement created by CMP, the FWHM of SL fringe −3 has decreased from 389" to 159", a level comparable to simulated diffraction pattern for the given structure.

Discussion

The equilibrium formation of $In_xGa_{1-x}As$ by HVPE can be described by the coupled reactions of GaAs and InAs:

$$GaCl_{(g)} + \frac{1}{2}H_{2(g)} + \frac{1}{4}As_{4(g)} \overset{K_1}{\leftrightarrow} GaAs_{(s)} + HCl_{(g)} \quad (1)$$

$$InCl_{(g)} + \frac{1}{2}H_{2(g)} + \frac{1}{4}As_{4(g)} \overset{K_2}{\leftrightarrow} InAs_{(s)} + HCl_{(g)} \quad (2)$$

characterized by the equilibrium constants:

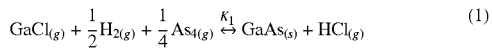

$$K_1 = \frac{a_{GaAs}P_{HCl}}{P_{GaCl}P_{As_4}^{1/4}P_{H_2}^{1/2}} \quad (3)$$

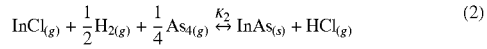

$$K_2 = \frac{a_{InAs}P_{HCl}}{P_{InCl}P_{As_4}^{1/4}P_{H_2}^{1/2}} \quad (4)$$

where $a_{GaAs}$ and $a_{InAs}$ are the activities of the pure solid species which are assumed to be 1 in this case. In this model, the layer composition can be expressed as a function of the relative growth rates of each species:

$$x_{InAs} = \frac{r_{InAs}}{r_{GaAs} + r_{InAs}} \quad (5)$$

A simple mass action rate law would suggest that the growth rate of each species is a first order function of the metal chloride, i.e.

$$r_{GaAs} = k_1^+ P_{GaCl}P_{As_4}^{1/4}P_{H_2}^{1/2} - k_1^- P_{HCl} \quad (6)$$

$$r_{InAs} = k_2^+ P_{InCl}P_{As_4}^{1/4}P_{H_2}^{1/2} - k_2^- P_{HCl} \quad (7)$$

where $k_1^\pm$ is the kinetic rate constant. Under conditions where $r_{GaAs} \gg r_{InAs}$, the $x_{InAs}$ becomes approximately a linear function of $P_{InCl}$ if the other growth parameters, e.g. T, $P_{HCl}$, etc, are held constant.

All of the growths in this example were conducted below x≈0.4, and also exhibited the same generally linear relationship between $P_{InCl}$ and $x_{InAs}$ when all other parameters were held constant. This dependence is quite useful for stepped MBL growth, since the buffer layer composition can be simply and reproducibly varied through a single growth parameter, $P_{InCl}$.

The effect of the extra HCl on growth rate can also be explained through the rate laws in eqns. (6) and (7). HCl is generated as a product of the growth reaction and hence the addition of 'extra' HCl should drive the reaction towards the reactant side as described in eqns. (6) and (7), the increase in $P_{HCl}$ would decrease the growth rate, which was the observed behavior in this example.

The effect of the extra HCl on composition may be understood through consideration of the relationships between the equilibrium constants and the forward and reverse rate constants. At 740° C., $K_1$=3.48, while $K_2$=0.279, calculated using data from J. B. Mullin et al., "Epitaxy of mixed III-V compounds", *Journal of Luminescence*, 7 (1973) 176-191. Thus it can be expected that $k_2^- > k_1^-$ (since $K_i = k_i^+/k_i^-$)

and an increase in $P_{HCl}$ will cause a greater decrease in the $r_{InAs}$ relative to the $r_{GaAs}$, all other conditions held constant. By (5), $x_{InAs}$ should therefore be reduced, even though $P_{InCl}/P_{GaCl}$ remains unchanged. This behavior was observed in this example.

The decrease in growth rate as a function of increasing $P_{InCl}$ cannot be explained through such a simple rate law model. Some HVPE GaAs studies have shown that the growth rate will increase with $P_{GaCl}$ to a point, whereupon the growth rate decreases with increases in $P_{GaCl}$. This growth rate decrease has been attributed to a competitive surface adsorption process between GaCl and $As_2/As_4$. The relatively high surface adsorption energy of GaCl leads to a high GaCl surface coverage at high $P_{GaCl}$, blocking the adsorption of As species. The blocking of the As absorption leads to suppression of the surface reaction that leads to GaAs deposition. Furthermore, the desorption of Cl from an activated As—Ga—Cl surface species is considered to be the rate-limiting step in the growth process and a high surface coverage of GaCl suppresses this Cl-desorption.

A similar behavior may be responsible for the observed decrease in alloy growth rate as a function of increasing $P_{InCl}$. In this example, the surface coverage of InCl gradually increases with $P_{InCl}$, preventing the adsorption of the As species, thus retarding the growth rate. The trend of decreasing growth rate was observed for all of the samples, implying that the growth rate under the conditions used were limited by kinetic processes at the surface. The growth rate also increases with temperature even though increasing temperature drives the equilibrium reaction towards the reactants.

The MBL structures grown in this example exhibited a high degree of relaxation, down to a residual strain of −0.0011±0.0001. The lower layers of the structure were completely relaxed (within the detection limit by XRD), while the top few layers contained some residual strain. Work hardening may have limited the strain relaxation. Nevertheless, the residual strain in this HVPE MBL structure is significantly lower than in MBLs grown with forward grading by MBE. See K. L. Kavanagh et al., "Lattice tilt and dislocations in compositionally step-graded buffer layers for mismatched InGaAs/GaAs heterointerfaces", in, AVS, 1992, pp. 1820-1823; D. Lee et al., "Characterization of metamorphic $In_xAl_{1-x}As/GaAs$ buffer layers using reciprocal space mapping", *Journal of Applied Physics*, 101 (2007) 063523-063528; F. Romanato et al., "Strain relaxation in graded composition In$_x$Ga$_{1-x}$As/GaAs buffer layers", *Journal of Applied Physics*, 86 (1999) 4748-4755; P. Kidd et al., "Comparison of the crystalline quality of step-graded and continuously graded InGaAs buffer layers", *Journal of Crystal Growth*, 169 (1996) 649-659; J. M. Chauveau et al., "Indium content measurements in metamorphic high electron mobility transistor structures by combination of x-ray reciprocal space mapping and transmission electron microscopy", *Journal of Applied Physics*, 93 (2003) 4219-4225; Y. Cordier et al., "Comparison of In$_{0.33}$Al$_{0.67}$As/In$_{0.34}$Ga$_{0.66}$As on GaAs metamorphic high electron mobility transistors grown by molecular beam epitaxy with normal and inverse step on linear graded buffer layers", *Journal of Vacuum Science & Technology B: Microelectronics and Nanometer Structures*, 18 (2000) 2513-2517; and D. Gonzalez et al., "Step-graded buffer layer study of the strain relaxation by transmission electron microscopy", *Materials Science and Engineering: B*, 28 (1994) 497-501). The use of a grading rate orders of magnitude lower than MBE or MOVPE (growth rates ~1-5 μm/hr) helps to spread out the dislocations and minimize their interactions. Growth at higher temperatures than MBE (740° C. vs. ~500° C.) should also increase TD glide velocity.

The high growth rates afforded by the disclosed HVPE methods can provide layers thick enough to allow the required excess sacrificial material for subsequent CMP planarizing, allowing for a reduction in surface roughness caused by cross hatch. The marked contrast in the x-ray spectra of the SLs grown on the as-grown MBL versus the planarized MBL indicate that HVPE In$_x$Ga$_{(1-x)}$As MBLs combined with CMP planarizing is a useful route to deposition of these strained SL devices. The incorporation of a selective etch layer would also allow the transfer of the MOVPE-grown layer to another handle wafer allowing reuse of the MBL substrate.

Example 2

In this Example, In$_x$Ga$_{1-x}$As MBL structures prepared according to the techniques described in Example 1 were subjected to a variety of post-growth steps, including planarizing using chemical-mechanical polishing (CMP). A Logitech CDP unit was used for CMP, in conjunction with a SUBA X polyurethane polishing pad and Ultra-Sol 556 60 nm colloidal silica slurry (a 60 nm colloidal silica solution mixed with 4% sodium hypochlorite). The pressure applied to the samples during CMP was determined to be a critical parameter and at a high value of pressure (about 12 psi), CMP was found to actually degrade the surface morphology of the as-grown surface. After polishing an MBL structure having a cap layer of In$_{0.35}$Ga$_{0.65}$As at 12 psi, hillocks were observed up to 120 nm in height. This effect was more prominent in samples with greater indium content, as the diameter of the hillocks increased linearly from 0 to 50 μm over a range of 0 to 100% indium, i.e. GaAs to InAs. Highly planar surfaces were achieved when the pressure was lowered from 12 psi to 4.5 psi. Surface cross-sections of a In$_{0.31}$Ga$_{0.69}$As MBL structure taken with a Zygo white-light interferometer with a vertical resolution of 0.1 nm showed that CMP at 4.5 psi planarized the surface, reducing the 140 nm peak-valley defects to a RMS roughness of less than 6 nm over a 350 μm$^2$ region (data not shown).

After CMP, the processed surface, while planar, retained a small amount of surface damage. A chemical polishing (CP) step in a commercial polishing unit using a Bromine-Methanol etchant was used to remove this potential damage while maintaining a planar surface. The RMS roughness as measured by AFM over a 10×10 μm area was reduced from 1.49 nm to 0.87 nm in a In$_{0.235}$Ga$_{0.265}$As MBL structure using a chemical polishing step after CMP.

Even after CP there was significant carbon contamination on the surface of the sample, possible originating from the polishing pad, as evidenced by Auger Electron Spectroscopy (AES). Such contamination may impedes the final etch (NH$_4$OH+H$_2$O$_2$+H$_2$O) used to prepare the sample for regrowth. Ozone immersion in a Novascan PDS-UVT ozone generator for one hour was used to effectively remove the carbon layer, preparing the samples for the final wet etch and regrowth. AES confirmed the removal of the carbon layer (data not shown).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A virtual substrate comprising:
    a semiconductor growth substrate having a first lattice constant; and
    a substantially strain-relaxed metamorphic buffer layer structure comprising one or more layers of a semiconductor alloy on the growth substrate, the metamorphic buffer layer structure being compositionally graded such that the lattice constant of the metamorphic buffer layer structure transitions from a lattice constant at the interface with the growth substrate that is substantially the same as the first lattice constant to a second lattice constant at a surface opposite the interface that is different from the first lattice constant,
    wherein the thickness of the metamorphic buffer layer structure is at least about 10 μm,
    and further wherein the ratio of the thickness of the metamorphic buffer layer structure to the thickness of the growth substrate is less than a value above which value warping of the metamorphic buffer layer structure would occur.

2. The virtual substrate of claim 1, wherein the thickness of the metamorphic buffer layer structure is at least about 20 μm.

3. The virtual substrate of claim 1, wherein the thickness of the metamorphic buffer layer structure is at least about 25 μm.

4. The virtual substrate of claim 1, wherein the ratio of the thickness of the metamorphic buffer layer structure to the thickness of the growth substrate is less than about 0.08 or the ratio of the thickness of the growth substrate to the diameter of the virtual substrate is at least about 0.20 mm/inch.

5. The virtual substrate of claim 1, wherein the semiconductor growth substrate is GaAs and the semiconductor alloy is InGaAs, GaAsSb or GaAsP.

6. The virtual substrate of claim 1, wherein the first lattice constant differs from the second lattice constant by at least about 0.5%.

7. The virtual substrate of claim 1, wherein the first lattice constant differs from the second lattice constant by at least about 1.5%.

8. The virtual substrate of claim 1, wherein the semiconductor growth substrate is GaAs and the metamorphic buffer layer structure comprises $In_xGa_{1-x}As$ wherein x is graded from a value substantially near to 0 to a maximum value, wherein the maximum value is in the range of from about 0.1 to about 0.4.

9. The virtual substrate of claim 8, wherein the thickness of the metamorphic buffer layer structure is at least about 20 μm.

10. The virtual substrate of claim 8, wherein the thickness of the metamorphic buffer layer structure is at least about 25 μm.

11. The virtual substrate of claim 8, wherein the ratio of the thickness of the metamorphic buffer layer structure to the thickness of the growth substrate is less than about 0.08 or the ratio of the thickness of the growth substrate to the diameter of the virtual substrate is at least about 0.20 mm/inch.

12. The virtual substrate of claim 1, further comprising a selective etch layer on the metamorphic buffer layer structure.

13. The virtual substrate of claim 1, further comprising a semiconductor device on the metamorphic buffer layer structure.

14. A method of making a virtual substrate, the method comprising
growing a substantially strain-relaxed metamorphic buffer layer structure comprising one or more layers of a semiconductor alloy on a semiconductor growth substrate via hydride vapor phase epitaxy, the metamorphic buffer layer structure being compositionally graded such that the lattice constant of the metamorphic buffer layer structure transitions from a lattice constant at the interface with the growth substrate that is substantially the same as the first lattice constant to a second lattice constant at a surface opposite the interface that is different from the first lattice constant,
wherein the thickness of the metamorphic buffer layer structure is at least about 10 μm,
and further wherein the ratio of the thickness of the metamorphic buffer layer structure to the thickness of the growth substrate is less than a value above which value warping of the metamorphic buffer layer structure would occur.

15. The method of claim 14, wherein the method further comprises planarizing the top surface of the metamorphic buffer layer structure using chemical-mechanical polishing, wherein the chemical-mechanical polishing is carried out using a polishing pressure of less than about 12 psi.

16. The method of claim 15, wherein the polishing pressure is in the range of from about 2 psi to about 6 psi.

17. A method of using a virtual substrate, the method comprising
growing a first semiconductor device over a virtual substrate, the virtual substrate comprising
a semiconductor growth substrate having a first lattice constant; and
a substantially strain-relaxed metamorphic buffer layer structure comprising one or more layers of semiconductor alloy on the growth substrate, the metamorphic buffer layer structure being compositionally graded such that the lattice constant of the metamorphic buffer layer structure transitions from a lattice constant at the interface with the growth substrate that is substantially the same as the first lattice constant to a second lattice constant at a surface opposite the interface that is different from the first lattice constant,
wherein the thickness of the metamorphic buffer layer structure is at least about 10 μm,
and further wherein the ratio of the thickness of the metamorphic buffer layer structure to the thickness of the growth substrate is less than a value above which value warping of the metamorphic buffer layer structure would occur;
removing the first semiconductor device from the virtual substrate; and
reusing the virtual substrate to grow a second semiconductor device.

18. The method of claim 17, further comprising removing the first semiconductor device from the virtual substrate by etching a selective etch layer between the top surface of the metamorphic buffer layer structure and the semiconductor device.

19. The method of claim 17, further comprising removing a portion of the material at the top surface of the metamorphic buffer layer structure prior to reusing the virtual substrate.

20. The method of claim 19, further comprising removing at least about 2 μm of the top surface of the metamorphic buffer layer structure.

* * * * *